United States Patent
Cheng

(10) Patent No.: US 7,186,350 B2
(45) Date of Patent: Mar. 6, 2007

(54) METHOD FOR REMOVING COLOR RESIST FOR EXPOSURE ALIGNMENT

(75) Inventor: Chi-Ming Cheng, Tainan (TW)

(73) Assignee: TPO Displays Corp., Chu-Nan (TW)

( * ) Notice: Subject to any disclaimer, the term of this patent is extended or adjusted under 35 U.S.C. 154(b) by 362 days.

(21) Appl. No.: 10/840,707

(22) Filed: May 6, 2004

(65) Prior Publication Data

US 2004/0241594 A1    Dec. 2, 2004

(30) Foreign Application Priority Data

May 7, 2003    (TW) .............................. 92112394 A

(51) Int. Cl.
- B44C 1/22    (2006.01)
- C03C 15/00    (2006.01)
- C03C 25/68    (2006.01)
- C23F 1/00    (2006.01)
- C30B 33/00    (2006.01)

(52) U.S. Cl. .......................................... 216/41; 216/23
(58) Field of Classification Search ................ 216/12, 216/41, 92; 134/21, 104.2; 156/345.18, 156/345.19; 430/7

See application file for complete search history.

(56) References Cited

U.S. PATENT DOCUMENTS 5,731,110 A * 3/1998 Hishiro et al. .................. 430/7

FOREIGN PATENT DOCUMENTS

JP             04206626 A * 7/1992

* cited by examiner

Primary Examiner—Parviz Hassanzadeh
Assistant Examiner—Roberts Culbert
(74) Attorney, Agent, or Firm—Liu & Liu

(57) ABSTRACT

A method for removing color resist from an exposure alignment mark. In an embodiment, a color resist layer is formed over a color filter substrate with an alignment mark thereon. A concentric tube system is provided with an outer tube surrounding an inner tube. A solvent is injected via the inner tube to contact and dissolve the color resist directly overlying the alignment mark. The dissolved color resist is extracted by the outer tube of the concentric tube system to expose the alignment mark. By repeating the dissolving and extraction steps, all alignment marks on the color filter substrate are consequently uncovered for subsequent exposure alignment.

8 Claims, 3 Drawing Sheets

METHOD FOR REMOVING COLOR RESIST FOR EXPOSURE ALIGNMENT

BACKGROUND OF THE INVENTION

1. Field of the Invention

The present invention relates to a color filter fabrication in a TFT-LCD process, and in particular to a method to remove color resist above alignment marks for photolithography alignment.

2. Description of the Related Art

The size of TFT-LCD display area is increased due to market demand and fabrication improvement. The size of base materials, such as glass substrates, is also required to be enlarged correspondingly. For example, the size of the glass substrates was 300 mm×400 mm in 1989, 500 mm×650 mm in 1996 and is now 1000 mm×1000 mm in a fifth generation.

The TFT-array and color-filter substrates are made into an LCD panel by assembling the two substrates together with a sealant, while the cell gap is maintained by spacers. Contrary to the transparent photoresist (i.e. a positive photoresist) used in TFT-array fabrication, the color filter is fabricated by color-resists, i.e. the primary colors of red, blue and green, formation and definition. For small size color filter, the conventional photolithography of a color filter substrate covered with a color resist thereon is conducted by one shot exposure with a mask that is approximately equal to the color filter substrate in dimension. There are usually alignment marks pre-disposed at the edges of the color filter substrate for a photolithography alignment to calibrate the exposure location. Two issues arise in the above process. First, the color resist covering the alignment marks results in difficulty in alignment due to the low transparency of the color resist. The low contrary and high optical density of the color resist also cause difficulty in alignment. Second, the color resist layer at the edge of the substrate is thicker than in the center, which results in a different developing rate for the color resist layer. The unevenness of the color resist layer leads to color resist remaining and thus contaminating subsequent fabrication equipment. A conventional solution for uneven color resist deposition is to remove the color resist layer from the edge before exposure by Edge Beam Removing (herein EBR) to expose the alignment marks. Specific solvents are utilized for EBR equipment to dissolve the overly thick color resist from the edge and then wash away the waste color resist solution.

FIGS. 1A and 1B further illustrate a conventional process of color resist removal from the edge of a color filter substrate.

A color filter substrate 10 is provided with alignment marks 12 disposed thereon for alignment and a color resist layer 14 formed over the color filter substrate 10. An EBR equipped with four EBR heads 16 is utilized to remove the color resist layer from the edge of the substrate 10. The movement 17 of the four EBR heads 16 along the four sides of the rectangular substrate 10 is shown in FIG. 1A. The EBR heads 14 inject a specific solvent 18 at the edge of the substrate 10 to dissolve the color resist thereon, as shown in FIG. 1B. An exhaust 20 on the EBR head 14 extracts the dissolved color resist and the remaining solvent, consequently exposing the alignment marks 12 on the substrate 10 and preventing color resist residue after exposure.

For fabricating large size color filters, such as substrates over 1000 mm×1000 mm, masks for photolithography are smaller than color filter substrates, which means multi-shot exposure for the whole substrate is required. The exposure of a large size color filter is usually performed by multi-exposing. For example, a 1000 mm×1000 mm color filter substrate is exposed with a stepper for four alignments and four exposures. To achieve this, alignment marks have to be pre-disposed on both the central area and the edge of the substrate to align the stepper. However, conventional EBR can only remove the color resist from the edge but not from over the alignment marks on the central substrate. The low transparency of the color resist on the central substrate blocks the alignment marks and results in difficulty in stepper alignment.

The conventional solution is to modify the alignment modules on exposure equipment or to improve the transparence characteristics of color resist. However, these solutions usually create higher costs and provide only limited improvement.

SUMMARY OF THE INVENTION

Hence, there is a need to remove color resist from certain areas, i.e. alignment marks, before exposure alignment.

The present invention features mobile color resist removal for any selected area. A specific solvent is injected to contact the target photo resist area by capillarity and consequently dissolves the color resist. The dissolved color resist is then simultaneously removed by vacuum suction to expose the underlying alignment marks. For larger size color filter substrates, i.e. substrates larger than 1000 mm×1000 mm, the alignment marks for exposure alignment, whether in the center or edge of the substrate, can be exposed easily. The "center" or "central substrate" referred to herein is only a general concept to distinguish from the "edge" of the substrate. More preferably, it refers to the area on a color filter substrate that the conventional EBR cannot reach.

To achieve this, the present invention provides a method for removing color resist. In a preferred embodiment, a color resist layer is formed over a color filter substrates with alignment marks thereon. A concentric tube system is provided with an outer tube surrounding an inner tube. A solvent is injected via the inner tube to contact the color resist over one alignment mark and dissolve the color resist thereon. The dissolved color resist is extracted by vacuum through the outer tube of the concentric tube system to expose the alignment mark. By repeating the dissolving and extraction steps, all alignment marks on the color filter substrate are consequently revealed for subsequent exposure alignment.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
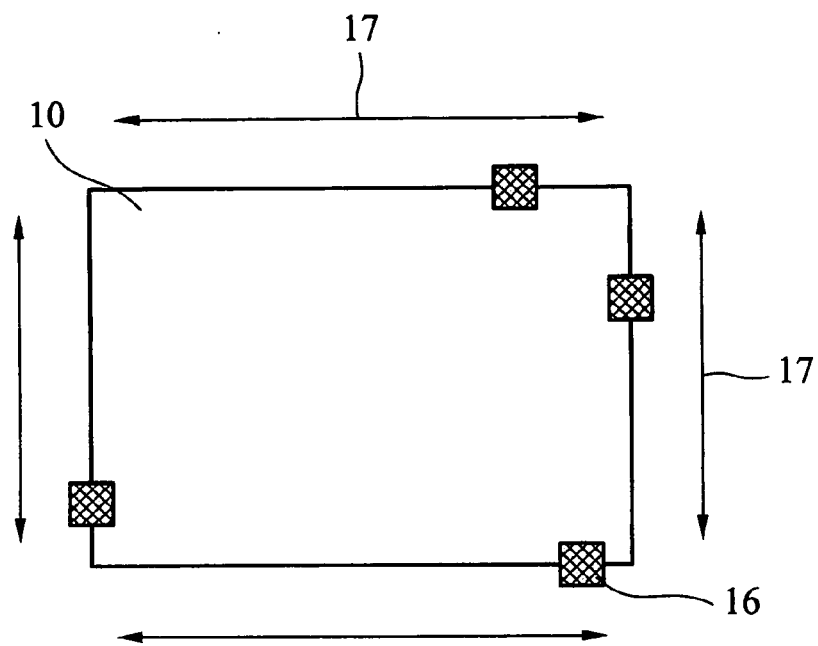
FIGS. 1A and 1B illustrate a conventional process to remove a portion of a color resist layer at the edge of a color filter substrate as referenced in the Prior Art.
Figure 1B:
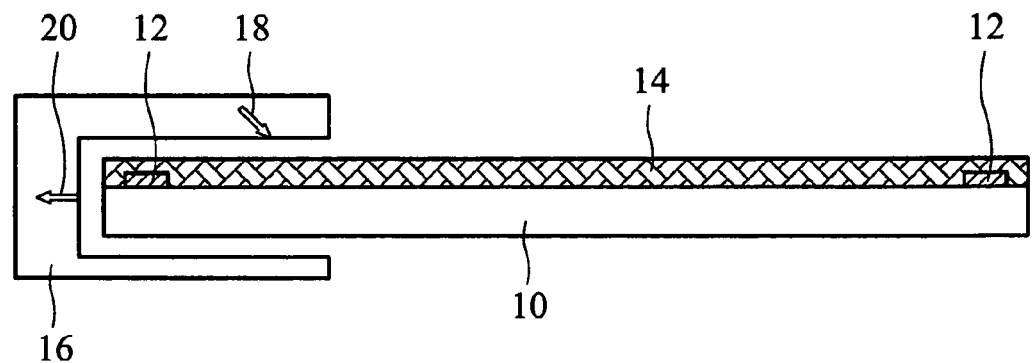
Figure 2A:
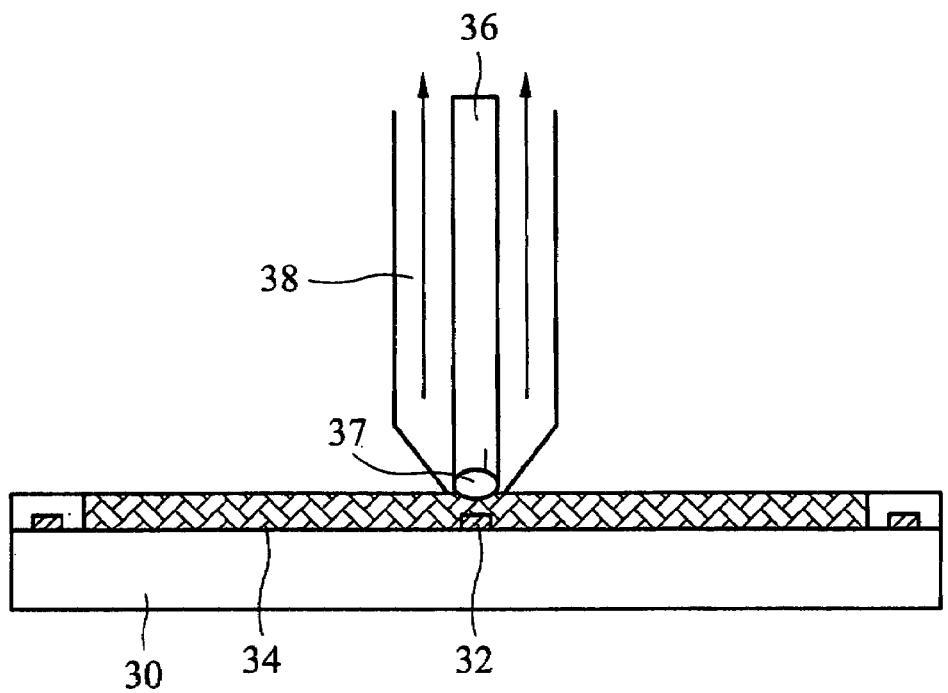
FIGS. 2A to 2C illustrate schematic views of color resist removal from a color filter substrate according to embodiments of the invention.

FIGS. 2A to 2A illustrate schematic views of color resist removal from a color filter substrate according to embodiments of the invention.

Figure 2B:
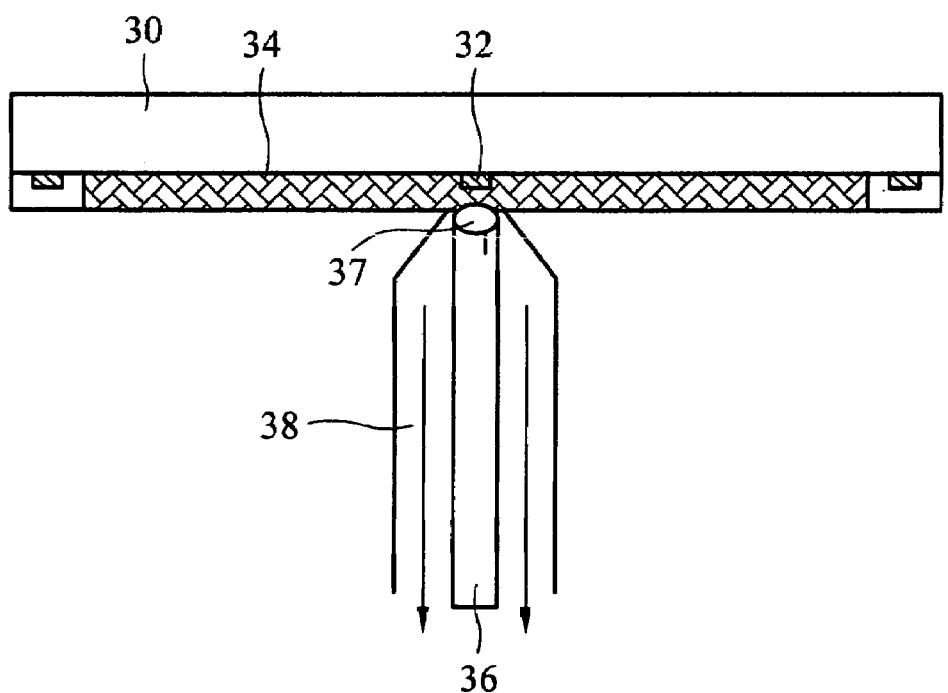

FIG. 2A is a top view of a substrate 30 and FIG. 2B is the bottom view thereof. Aligned marks 32 are pre-disposed on the substrate 30, e.g. a glass substrate, for exposure alignment. A color resist layer 34 is formed covering the surface of the glass substrate 30 by spin coating. Preferably, the color resist is red, green, blue, or black dye or pigment conventionally used for color filters. To remove the color resist blocking the alignment marks 32, a mobile concentric tube system with two tubes is utilized to inject a solvent and extract the dissolved color resist. In an embodiment, the concentric tube system comprises an inner tube 36 supplying a solvent 37 and an outer tube 38 surrounding the inner tube 36 providing vacuum suction. The solvent 37 in the inner tube 36 flows to the target color resist above the alignment mark 32 and adheres to the target color resist by gravity and capillarity, as shown in FIG. 2A. In another embodiment, the solvent 37 in the inner tube 36 adheres to the target color resist above the alignment mark 32 mainly by capillarity, as shown in FIG. 2B. In this condition, solvents with higher cohesion than adhesion, such as Methyl-Ethyl-Ketone (MEK) or Ethyl lactate (EL), are preferred for utilization. The low adhesion solvents contact and adhere only to the target area and thus prevent diffusion to the surrounding color resist areas.

Figure 2C:
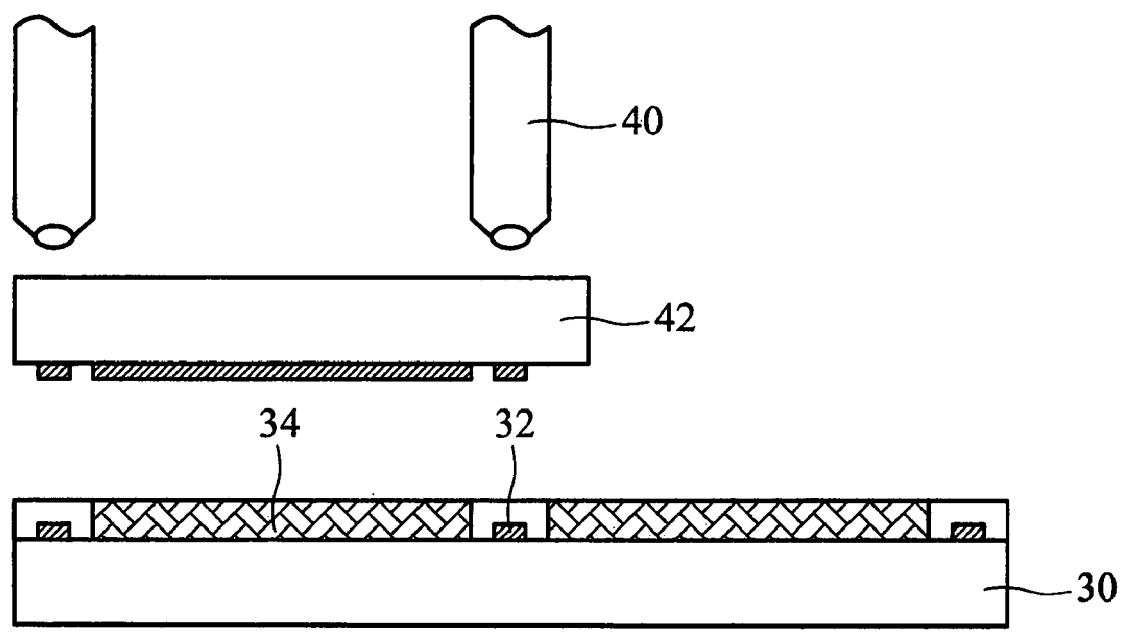

The solvent 37 adheres to the target area of the color resist, i.e. the color resist directly above the alignment mark 32, via the inner tube 36. The dissolved color resist is simultaneously removed by vacuum extraction through the outer tube 38, as shown in FIGS. 2A and 2B. After extraction, the underlying alignment mark 32 is then exposed for exposure alignment. FIG. 2C illustrates a glass substrate 30, from which the color resist over the alignment mark 32 in the center has been removed according to the present invention. An alignment between a color filter mask 42 and the glass substrate 30 is performed by way of a microscope 40. No color resist covers the alignment marks and thus highly accurate alignment can be achieved.

Conventional EBR can only remove color resist from the edge of the color filter substrate but not the center. As the TFT-LCD industry develops larger size TFT-LCD, more and more alignment marks will be pre-disposed in the center of the substrate. The present invention provides a solution to remove the color resist from any area on a color filter substrate with a concentric tube system to inject a solvent and extract dissolved materials.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for removing color resist for exposure alignment, the method comprising:
   providing a substrate with an alignment mark thereon;
   forming a color resist layer over the substrate and the alignment mark;
   injecting a solvent with an inner tube of a concentric tube system to contact the color resist over the alignment mark and dissolve the color resist, wherein the concentric tube system comprises an outer tube surrounding the inner tube; and
   extraction of the dissolved color resist by the outer tube to expose the alignment mark.

2. The method as claimed in claim 1, wherein the size of the substrate with the alignment mark exceeds 1000 mm×1000 mm.

3. The method as claimed in claim 1, wherein the substrate is a glass substrate.

4. The method as claimed in claim 1, wherein the color resist layer is formed by spin coating.

5. The method as claimed in claim 1, wherein the color resist is red, blue, green, or black dye or pigment.

6. The method as claimed in claim 1, wherein the solvent contacts the color resist by capillarity.

7. The method as claimed in claim 1, wherein the cohesion of the solvent exceeds the adhesion thereof.

8. The method as claimed in claim 1, the alignment mark is located in the center of the substrate.

* * * * *